United States Patent [19]

Ishigaki et al.

[11] 3,988,598
[45] Oct. 26, 1976

[54] MULTIPURPOSE SEMICONDUCTOR CIRCUITS UTILIZING A NOVEL SEMICONDUCTOR DEVICE

[75] Inventors: Yoshio Ishigaki, Tokyo; Takashi Okada, Yokohama, both of Japan

[73] Assignee: Sony Corporation, Tokyo, Japan

[22] Filed: Mar. 25, 1975

[21] Appl. No.: 561,915

[30] Foreign Application Priority Data

Apr. 10, 1974    Japan................................ 49-41463

[52] U.S. Cl.................................. 307/254; 307/264; 329/50; 329/103; 330/29; 330/30 D; 357/33; 357/34; 357/37; 357/89
[51] Int. Cl.².................. H03K 17/68; H01L 29/08
[58] Field of Search.......... 307/DIG. 3, 235 T, 264, 307/241, 242, 249, 254; 330/29, 30 D; 328/169, 171, 172; 357/14, 90, 33, 34, 89; 329/50, 103

[56] References Cited
UNITED STATES PATENTS

| | | | |
|---|---|---|---|
| 2,862,171 | 11/1958 | Freeborn | 307/317 |
| 3,660,679 | 5/1972 | Ishigaki et al. | 330/30 D |
| 3,772,097 | 11/1973 | Davis | 357/14 |

*Primary Examiner*—John Zazworsky
*Assistant Examiner*—Marcus S. Rasco
*Attorney, Agent, or Firm*—Hill, Gross, Simpson, Van Santen, Steadman, Chiara & Simpson

[57] ABSTRACT

A multipurpose semiconductor circuit of the balanced type comprising a pair of differential signal transmitting paths, each of which is formed by a first transistor supplied with an input signal, a second transistor connected in series to the first transistor and supplied with a constant bias or a control signal, a load with an output terminal connected to the second transistor, and a novel semiconductor device of the three-terminal type with first and third terminals connected to connection points between first and second transistors of both signal transmitting paths, respectively. A second terminal of the novel semiconductor device is supplied with a control signal or a constant bias. The input signal is controlled in accordance with the control signal supplied to the novel semiconductor device or the second transistor and derived from the output terminal. The novel semiconductor device has a semiconductor body similar to an ordinary transistor and acts as a bidirectionally conductive element with a superior symmetric characteristic.

7 Claims, 4 Drawing Figures

MULTIPURPOSE SEMICONDUCTOR CIRCUITS UTILIZING A NOVEL SEMICONDUCTOR DEVICE

BACKGROUND OF THE INVENTION

1. Field of the Invention

This invention relates generally to multipurpose semiconductor circuits used, for example, for forming a gain control circuit or switching circuit, and more particularly to solid state multipurpose circuits of the balanced type employing a novel semiconductor device of the three-terminal type with a superior symmetrical characteristic.

2. Description of the Prior Art

Several types of multipurpose semiconductor circuits have been proposed for use as, for example, a gain control circuit or a synchronous detector such as a color demodulator for demodulating a chrominance signal of a composite color television signal. In such circuits, at least one active semiconductor element, for example, a transistor is provided and a first signal which is to be controlled is applied to an input terminal connected to the semiconductor element. The semiconductor element is supplied with a second signal and controlled by the same so as to control the level of the first signal or switch the first signal to conduct intermittently in synchronism with the second signal.

There has also been a multipurpose semiconductor circuit of a different type which has a couple of input terminals and at least one output terminal connected to a circuit portion including active semiconductor elements to derive at the output terminal the multiplied result of first and second signals respectively applied to both input terminals in accordance with the operation of the semiconductor elements.

Such multipurpose switching circuits as described above are usually constructed in the form of a balanced type, that is, a pair of signal transmitting paths including, for example, a semiconductor element such as a transistor, are symmetrically provided with a common output terminal and differentially or alternately operate so as to provide increased efficiency or to avoid a change in the D.C. level of the output signal which tends to occur in response to the operation of the semiconductor element. Accordingly the circuits usually require a number of semiconductor elements performing the gain controlling, mixing or switching operation and moreover are relatively complicated in structure.

SUMMARY OF THE INVENTION

It is an object of the present invention to provide a multipurpose semiconductor circuit of the balanced type which requires a decreased number of elements performing the controlling operation by means of utilization of a novel semiconductor device.

Another object of the present invention is to provide a multipurpose semiconductor circuit having a novel and simplified balanced structure formed with a novel semiconductor device.

Yet another object of the present invention is to provide a multipurpose semiconductor circuit of the balanced type providing a superior symmetric characteristic notwithstanding its simple structure resulting from utilization of a novel semiconductor device which acts as a controlling device with symmetrically bidirectional conductivity.

This invention provides a multipurpose semiconductor circuit of the balanced type having a pair of signal transmitting paths connected to a input terminal, in which a novel semiconductor device supplied with a control signal or a constant bias is connected between both switching paths to produce a controlled signal at an output terminal connected to the signal transmitting path. The novel semiconductor device is constructed as a three-terminal device with a semi-conductor body similar to an ordinary transistor and able to perform the amplifying, gain controlling or switching operation like the ordinary transistor. One of the distinctive features of the novel semiconductor device is bidirectional conductivity of a superior symmetrical characteristic and this feature is mainly utilized in the multipurpose circuit according to the present invention.

Other objects, features and advantages of the present invention will become apparent from the following description taken in conjunction with the accompanying drawings.

DESCRIPTION OF THE PREFERRED EMBODIMENTS

Figure 1:
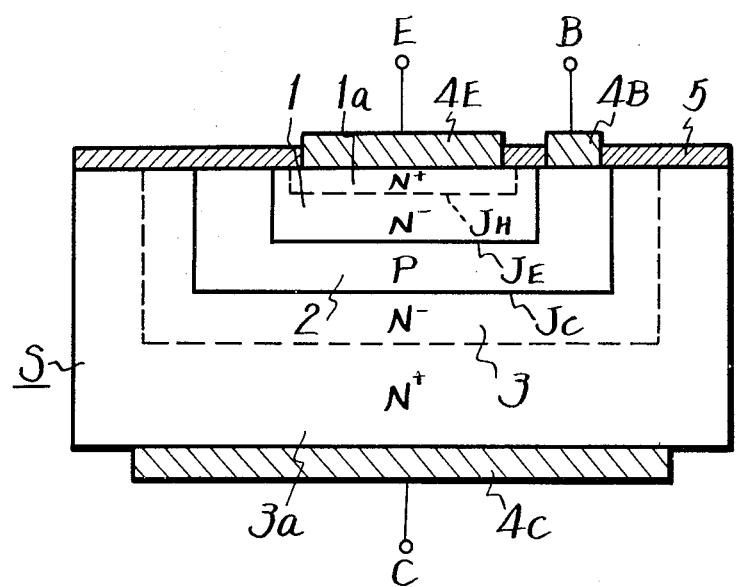
FIGS. 1 and 2 are cross-sectional views each showing an example of a semiconductor element which is useable in the present invention.

Before describing the present invention, an embodiment of the novel semiconductor device useable in the invention will be now described.

The emitter-grounded current amplification factor $h_{FE}$ of the a transistor, which is one of parameters for evaluating the characteristics of the bipolar transistor, can be expressed by the following equation (1), if the base-grounded current amplification factor of the transistor is taken as $\alpha$.

$$h_{FE} = \frac{\alpha}{1-\alpha} \tag{1}$$

The factor $\alpha$ is expressed as follows:

$$\alpha = \alpha^* \beta \gamma \cdots \tag{2}$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \tag{3}$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{-qD_n n_p}{L_n} \left\{ \exp\left(\frac{qV}{kT}\right) - 1 \right\} \quad (4)$$

$$J_p = \frac{-qD_p p_n}{L_p} \left\{ \exp\left(\frac{qV}{kT}\right) - 1 \right\} \quad (5)$$

the ratio $\delta$ of $J_n$ and $J_p$ is expressed as follows:

$$\delta = \frac{J_p}{J_n} = \frac{L_n}{L_p} \cdot \frac{D_p}{D_n} \cdot \frac{p_n}{n_p} \quad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; V a voltage applied to the emitter junction of the transistor; $k$ the Boltzman's constant; and T temperature.

It it is assumed that the impurity concentration in the emitter of the transistor is taken as $N_D$ and that in the base of the transistor taken as $N_A$, the term $p_n/n_p$ can be replaced by the term $N_A/N_D$. Further, since $L_n$ is restricted by the base width W and $L_n = W$, the ratio $\delta$ is expressed as follows:

$$\delta = \frac{W}{L_p} \cdot \frac{D_p}{D_n} \cdot \frac{N_A}{N_D} \quad (7)$$

The diffusion constants $D_n$ and $D_p$ are functions of transfer of the carrier and temperature and in this case they are assumed substantially constant.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm$^3$, lattice defects and dislocation occur in the crystal of the semiconductor body of the transistor to deteriorate the crystal. Further, due to the fact that the impurity concentration of the emitter itself is high, a life time $p$ of the minority carriers injected to the emitter from the base becomes short.

Since the diffusion distance $L_p$ is expressed by the following equation (8)

$$L_p = \sqrt{D_p t_p} \quad (8)$$

the diffusion distance $L_p$ of the minority carriers or holes becomes short. Therefore, as may be apparent from the equation (7), $\delta$ cannot be made very small and hence the injection efficiency $\gamma$ can not be made high over a certain value. As a result, the current amplification factor $h_{FE}$ can not be made very high in the ordinary transistor.

As mentioned previously, the novel semiconductor device useable in this invention is free from the defects mentioned above inherent to the prior art transistor. The semiconductor device used in this invention may be constructed as an NPN-type or a PNP-type, as in the case of the prior art transistor. An NPN-type semiconductor device useable in this invention will be now described with reference to FIGS. 1 and 2, by way of example.

As shown in FIG. 1, the NPN-type semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_C$ between the second and third regions 2 and 3, respectively.

With the semiconductor device useable in this invention and shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected sufficiently low such as in the order of $10^{15}$ atom/cm$^3$ and region 1a of N$^+$ type conductivity or the impurity concentration of about $10^{19}$ atom/cm$^3$ is formed in the first region 1 to form an LH-junction (low-high impurity concentration junction) and hence to form the barrier.

The impurity concentration in the second region 2 is selected in the order of $10^{15} - 10^{17}$ atom/cm$^3$ and that in the third region 3 is selected sufficiently low such as in the order of $10^{15}$ atom/cm$^3$.

In the semiconductor substrate S adjacent to the third region 3 but apart from the second junction $J_C$, there is formed a region 3a of N$^+$ type conductivity and with the impurity concentration of about $10^{19}$ atom/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith; respectively. From these electrodes 4E, 4B and 4C there are led out first, second and third terminals E, B and C, respectively. In FIG. 1, reference numeral 5 indicates an insulating layer made of, for example, SiO$_2$ and formed on the surface of the substrate S.

The semiconductor device shown in FIG. 1 can be used as a transistor. In such a case, the first region 1 serves as an emitter region; the second region 2 as a base region; and the third region 3 as a collector region, respectively. An forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be substantially lengthened. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be lengthened.

Due to the fact that the potential barrier is formed as described above in the example shown in FIG. 1, there is performed such an effect that the current density or component $J_p$ of the holes injected from the base region 2 to the emitter region 1 is reduced. That is, on the LH-junction $J_H$ in the emitter region 1, there is created a false Fermi level difference or built-in electric field which acts to suppress the diffusion of the holes or the minority carrier. Therefore, if the Fermi level is sufficiently high, the diffusion currents caused by the concentration gradient of holes and the drift current caused by the built-in electric field are cancelled on the LH-junction and therefore the hole current $J_p$ injected from the base 2 through the emitter region 1 of low impurity concentration is reduced. By this effect, the ratio of electron current arriving at the collector region 3 relative to the current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as $kT$ but the above level difference is desired to be more than 0.1 ev. Within the transistion region of the potential, the diffusion distance $L_p$ of the holes must not terminate within the transition region, or it is required that the diffusion distance $L_p$ of the hole must be greater than the width of the transition region.

In the case that LH-junction $J_H$ is formed as shown in FIG. 1, the potential barrier of 0.2 $eV$ can be formed by suitably selecting the amount of impurity and gradient of the high impurity concentration region $1a$.

Figure 2:
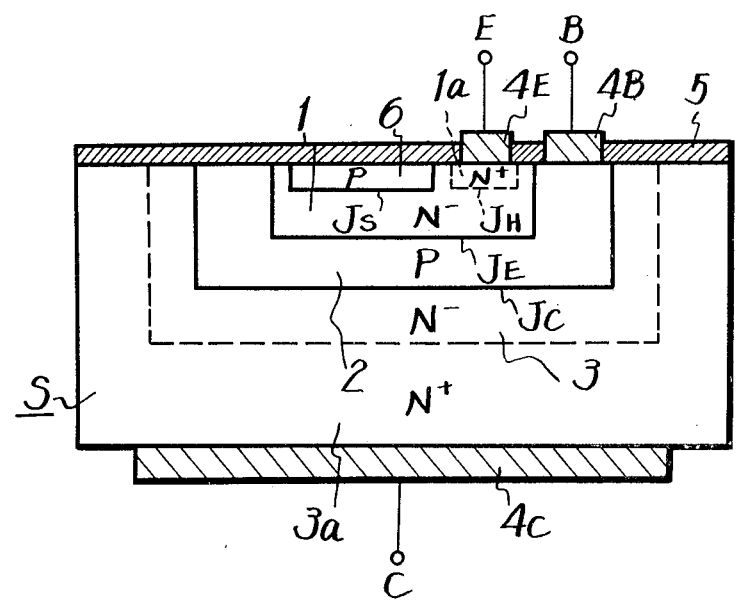

FIG. 2 shows another example of the semiconductor device useable with the invention in which reference numerals and letters same as those used in FIG. 1 indicate the same device so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from an electrical point of view, its potential is increased as the number of holes arriving at the additional region 6 is increased. Thus, the PN-junction $J_S$ formed between the regions 6 and 1 is forward biased to its rising-up voltage, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

In the example of FIG. 2, the additional region 6 which has the same conductivity type as that of the second region 2 is formed in the first region 1 separated from the second region 2, but it may be possible that the second region 6 is formed as a continuous extension from the second region 2.

The above description relates to operation of the first, second and third regions 1, 2 and 3 of the semiconductor devices as emitter, base and collector, respectively. However, in the above semiconductor devices the impurity concentrations of the first and third regions 1 and 3 surrounding the second region 2 are selected low of about equal order and they are arranged symmetrically with respect to the second region 2, so that if the first, second and third regions 1, 2 and 3 are used as, collector, base and emitter, respectively, the semiconductor devices can be operated as a transistor in reverse to the operating direction of those mentioned previously.

When the symmetry of the semiconductor devices is utilized, the symmetry can be emphasized by forming in the third region 3 a potential barrier facing the second junction $J_C$, surrounding the same and having the energy higher than that of the minority carrier or hole in the third region 3 as shown in FIGS. 1 and 2 by dotted lines outside the junction $J_C$. To this end, the region $3a$ of high impurity concentration in the third region 3 is so formed to surround the junction $J_C$ and the distance between the junction $J_C$ and the region $3a$ is selected smaller than the diffusion distance of the minority carrier or hole injected to the third region 3 at the respective parts.

The features of the novel semiconductor devices described above can be summarized as follows which will be apparent from the above description.

1. The current amplification factor $H_{FE}$ is high and can be increased to 3000 or greater.

2. The current amplification factor $h_{FE}$ is uniform. That is, with a prior art transistor, the impurity concentration of the emitter region is selected sufficiently high so as to increase the emitter injection efficiency or the current amplification factor. Since the prior art transistor depends upon the difference of the impurity concentrations near the junction between the emitter and base regions, it is required to select the impurity concentrations in both the regions relative to one another. On the contrary, in the semiconductor devices for use with the invention, by forming the potential barrier in the emitter region 1 facing the emitter junction $J_E$, the current component of the minority carrier injected in the emitter region 1 is suppressed to increase the emitter injection efficiency. Therefore, the mutual influence between the emitter and base regions 1 and 2 is small due to the fact that the emitter region 1 is selected relatively low in impurity concentration, and the width of the base region 2 and the distribution of impurity concentration therein can be selected as planned and hence $h_{FE}$ can be uniform as described above.

3. Since the effects of surface recombination is avoided, the current amplification factor $h_{FE}$ can be made high even if the current is low.

4. The noise can be reduced. That is, since the main parts of the first and second junctions $J_E$ and $J_C$ are formed between the low impurity concentration regions of P and N conductivity types, crystal defects are small. Further, if the impurity concentration near the electrode 4B attached to the second region 2, by way of example, is selected high, a component of the transistor emitter-base current, along the surface of the semiconductor substrate S can be reduced. Therefore, the noise of $1/f$ can be reduced. Further, the burst noise and noise of $1/f$ can be also reduced, since $h_{FE}$ is high. In addition, if a base expansion resistance $\gamma bb'$ is made small, the noise can be reduced even if the impedance of a signal source is low.

5. The current amplification factor $h_{FE}$ has good temperature characteristics.

6. The semiconductor devices can be used as bidirectionally conductive transistors, respectively, and are excellent in symmetry.

7. Since the impurity concentration in the vicinity of th first and second junctions $J_E$ and $J_C$ is low, $BV_{BEO}$ (collector-opened base-emitter voltage) is high for both the forward and reverse directions of transistors.

8. When the semiconductor devices are used as a power transistor, their strength is high because their emission is made uniform by their distributed inner resistance in their emitter region.

9. Saturation characteristics are superior.

10. When the region 6 is formed for injection or re-injection, the equivalent resistance of the base is made low.

This invention has its basis on the fact that the above novel semiconductor device has a body structure symmetrical with respect to its second semiconductor region and therefore has superior bidirectional conductivity, and provides a novel multipurpose semiconductor circuit such as a gain control circuit good in balance and small in number of parts or elements by using the novel semiconductor device.

Some embodiments of the invention will be now described with reference to the drawings.

Figure 3:
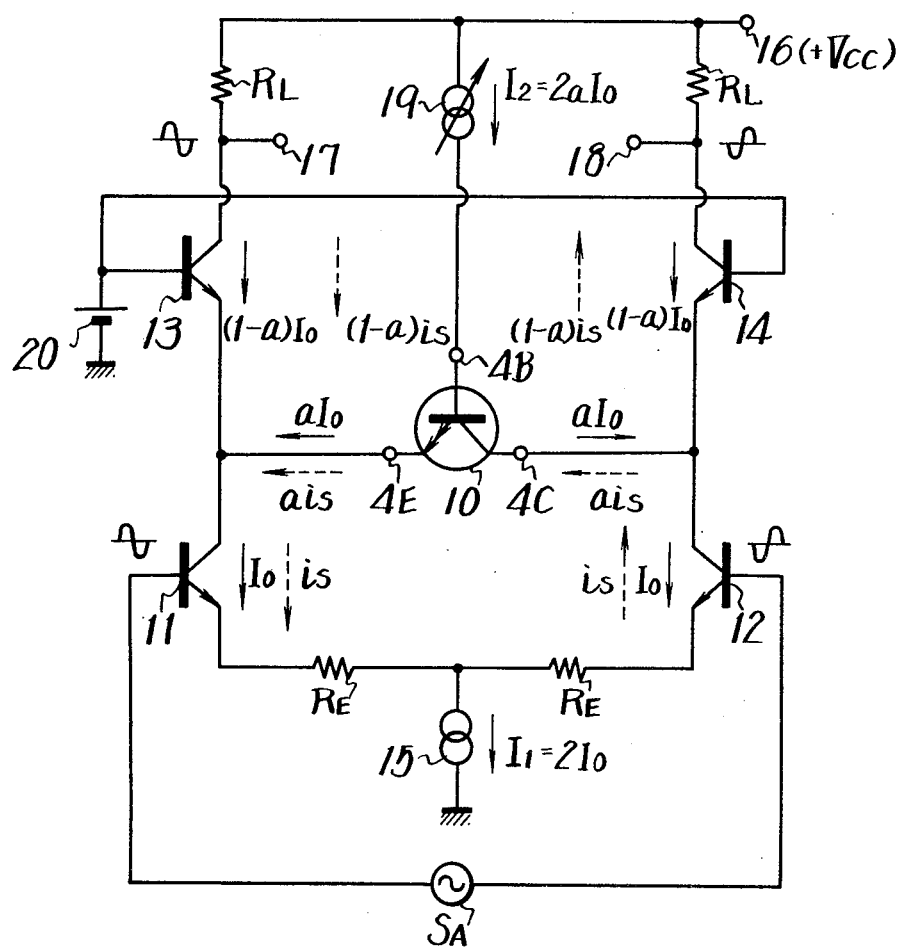
FIG. 3 is a schematic circuit diagram showing an embodiment of multipurpose semiconductor circuits according to the present invention.

FIG. 3 shows an embodiment of the invention in which a novel semiconductor device 10, the first to fourth transistors 11 to 14 are used. A first electrode 4E of the semiconductor device 10 is connected to the collector of the first transistor 11 and to the emitter of the third transistor 13; a third electrode 4C of the device 10 is connected to the collector of the second transistor 12 and to the emitter of the fourth transistor 14; and a series connection of two resistors $R_E$ is connected between the emitters of the first and second transistors 11 and 12. The connection point between the resistors $R_E$ is connected to a current sink 15, and the collectors of the third and fourth transistors 13 and 14 are connected through, for example, load resistors $R_L$ to a voltage source terminal 16 at which a positive voltage $+V_{cc}$ is obtained, respectively. Output terminals 17 and 18 are led out from the collector of the transistors 13 and 14, respectively. A signal $S_A$ supplies a signal to the bases of the transistors 11 and 12 differentially. In this case, the bases of the transistors 11 and 12 are supplied with a predetermined bias. Another current sink 19 is inserted between the voltage source terminal 16 and a second electrode 4B of the device 10, and the bases of the transistors 13 and 14 are supplied with a predetermined bias from a voltage source 20.

Since the device 10 has a symmetrical construction with respect to its second region as described above, when the second electrode 4B of the device 10 is supplied with a constant current from the current sink 19 as shown in FIG. 3, currents can flow from the second electrode 4B to the first and third electrode 4E and 4C of the device 10, respectively, and also the characteristics between the second and first electrodes 4B and 4E and between the second and third electrodes 4B and 4C can be made the same. Thus, the above two currents can be made equal.

Accordingly, in the case of the example shown in FIG. 3, when the bases of the transistors 11 and 12 are supplied with only an equal bias, if the current value $I_1$ of the current sink 15 is selected as $2I_0(I_1=2I_0)$, a current $I_0$ flows through the collectors of the transistors 11 and 12, respectively, while if the current value $I_2$ of the current sink 19 is selected as $2aI_0(I_2=2aI_0)$, a current $aI_0$ flows through the first and third electrodes 4E and 4C of the device 10, and a current of $(1-a)I_0$ flows through the collectors of the transistors 13 and 14, respectively.

When the signal $S_A$ is applied to the bases of the transistors 11 and 12 differentially, a signal current flows through the collectors of the transistors 11 and 12 in opposite direction, a signal current flows through the first and third electrodes 4E and 4C of the device 10 in opposite direction with respect to its second electrode 4B, and a signal current $(1-a)i_s$ flows through the collectors of the transistors 13 and 14 in opposite direction. Thus, output signals reverse in phase are obtained at the output terminals 17 and 18.

The ratio between the signal current is which flows through the collectors of the transistors 11 and 12 and the signal current $(1-a_{is}$ which flows through the collectors of the transistors 13 and 14 or gain G of the circuit shown in FIG. 3 is expressed as follows:

$$G = 1-a \cdots \qquad (9)$$

Accordingly, if the current value $I_2$ of the current sink 19 may be varied, the gain G could be controlled. Therefore, the circuit shown in FIG. 3 can be used as a gain control circuit. In this case, it may be possible to vary the current value $I_2$ of the current sink 19 manually. Further, if the current value $I_2$ is automatically varied with a gain control signal, the circuit can be made as an automatic gain control circuit.

In the embodiment of FIG. 3, if $I_2=I_1$ or $a=1$, no current flows through the transistors 13 and 14, and the current which flows through the first and third electrodes 4E and 4C of the device 10 flows unchanged through the transistors 11 12, respectively. However, if $I_2=0$ or $a=0$, no current flows through the device 10, and the current which flows through the transistors 13 and 14 also flows unchanged through the transistors 11 and 12, respectively. Accordingly, if the current $I_2$ flowing through the second electrode 4B of the device 10 is made $2I_0$ or zero with a switching signal, the circuit may be used as a switching signal.

Contrary to the embodiment shown in FIG. 3, it may be understood that if the second electrode 4B of the device 10 is supplied with a predetermined bias voltage and the bases of the transistors 13 and 14 are connected to a common current source for controlling, the same operations can be performed.

If the regions 1, 1a, 2, 3, 3a and 6 of the above novel semiconductor are made to have opposite conductivity types to those of FIG. 1 or 2 or the semiconductor device is formed as a PNP type the same operation can be also performed.

Accordingly, a PNP type element may be used as the device 10 and a PNP type transistor may be used as the first to fourth transistors 11 to 14 in this invention.

Further, since the above mentioned semiconductor device operates as a transistor, it can be used as the first to fourth transistors 11 to 14, respectively.

It is also possible to use a field effect transistor as each of the first to fourth transistors 11 to 14.

It is also possible that a load resistor is connected to a collector of one of the third and fourth transistors 13 and 14 and an output terminal is connected to the collector.

Figure 4:
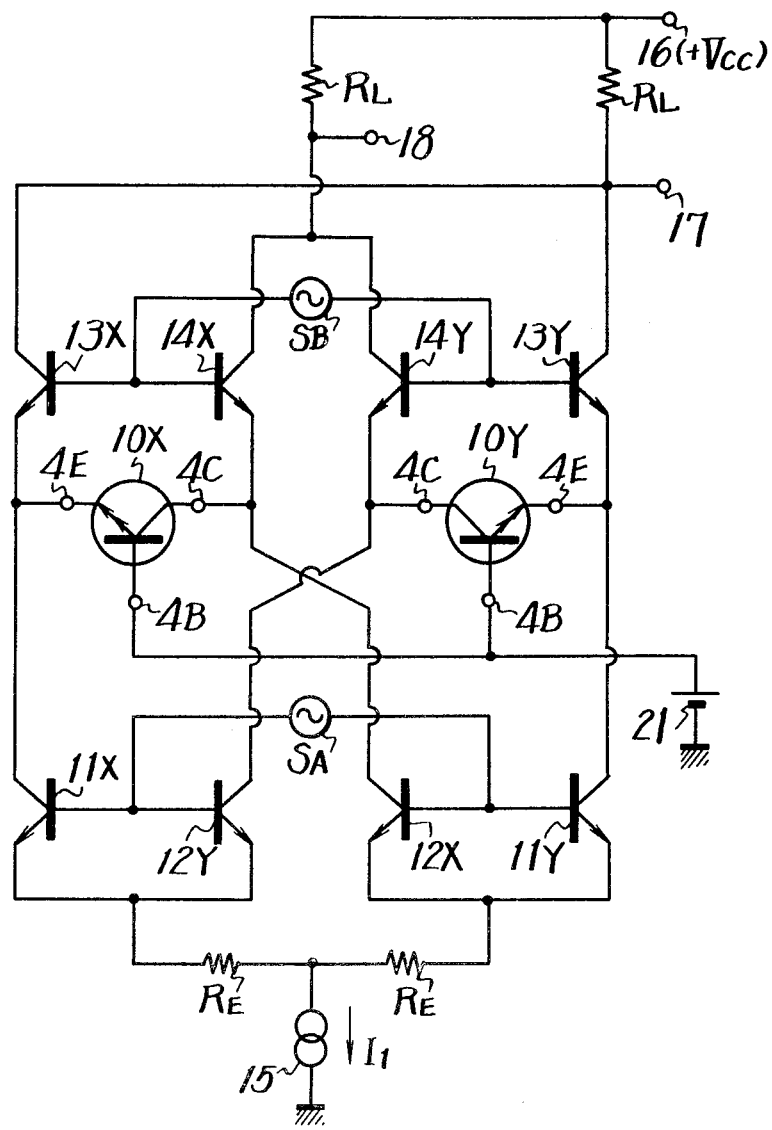
FIG. 4 is a schematic circuit diagram showing another embodiment of multipurpose semiconductor circuits according to the present invention.

FIG. 4 shows another embodiment of the invention in which the circuit of the invention is formed as a double-balanced type to be a multiplier circuit. The parts indicated by reference numerals with a letter X shows a first set and the parts indicated by corresponding reference numerals with letter Y show a second set.

In the embodiment of FIG. 4, the current sink 15 is common to both the sets, and the output terminals 17 and 18 are also fed commonly to both the sets. The first signal $S_A$ is differentially supplied to the bases of the first and second transistors 11X and 12X in the first set and to the bases of the first and second transistors 11Y and 12Y in the second set, respectively. The second signal $S_B$ is differentially applied to the bases of the third and fourth transistors 13X and 14X in the first set and to the bases of the third and fourth transistors 13Y and 14Y in the second set, respectively. Further, the second electrodes 4B of the semiconductor devices 10X and 10Y in the first and second sets are supplied with a predetermined bias voltage from the voltage source 21.

With the circuit constructed as above, multiplied signals of the first and second signals $S_A$ and $S_B$ and reverse in phase as obtained at the output terminals 17 and 18, and in this case the DC level of the output signal is not changed.

As described above, since the invention utilizes the superior symmetrical property of the novel semiconductor device, a differential type semiconductor circuit is provided which is good in balance and formed of few elements.

I claim as my invention:

1. A semiconductor circuit comprising:
   a. first and third transistors having first, second, and third electrodes, said first electrode of said first transistor being connected to said third electrode of said third transistor for forming a first signal transmitting path;
   b. second and fourth transistors having first, second, and third electrodes, said first electrode of said second transistor being connected to said third electrode of said fourth transistor for forming a second signal transmitting path;
   c. a current sink connecting in common to said first and second signal transmitting paths;
   d. means for supplying an input signal to said second electrodes of said first and second transistors differentially;
   e. an output terminal connected to at least one of said first and second signal transmitting paths;
   f. a semiconductor device comprising a first semiconductor region of one type, a second semiconductor region of the other type adjacent said first region with a first semiconductor junction therebetween, a third semiconductor region of the same type as said first region adjacent said second region with a second semiconductor junction therebetween, said first region being provided therein with a potential barrier having energy higher than that of minority carriers injected from the second region to the first region at the position facing said first junction and apart from the same by a distance smaller than a diffusion distance of the minority carriers, and first, second and third terminals led from said first, second and third regions, respectively, said first and third terminals being connected to a connection between said first and third transistors and a connection between said second and fourth transistors, respectively,
   g. first means for supplying a control bias to said second terminal of said semiconductor device, and
   h. second means for supplying a control bias to the second electrodes of both the third and fourth transistors.

2. A semiconductor circuit according to claim 1, wherein said first means comprises a variable current source connected to supply a variable current bias as a control signal to the second terminal of said semiconductor device and said second means comprises a constant bias source connected in common to the second electrodes of said third and fourth transistors.

3. A semiconductor circuit according to claim 1, wherein said first means comprises a constant bias source connected to the second terminal of said semiconductor device and said second means comprises a control signal source connected to supply the control signal in common to the second electrodes of said third and fourth transistors.

4. A semiconductor circuit according to claim 1, wherein all transistors are said semiconductor devices connected to function as transistors.

5. A semiconductor circuit according to claim 1, wherein said first and third regions of the semiconductor device have the impurity concentration in substantially the same order and said first region is provided therein a portion having the impurity concentration higher than other portions of the first region at the position apart from said first junction by a distance smaller than the diffusion distance of the minority carriers to make said potential barrier.

6. A semiconductor circuit according to claim 1, wherein said first and third regions of the semiconductor device have the impurity concentration in substantially the same order and an additional semiconductor region of the same type as said second region is provided in said first region at the position apart from said first junction by a distance smaller than the diffusion distance of the minority carrier to make said potential barrier.

7. A semiconductor circuit comprising:
   a. first and third transistors having first, second and third electrodes, said first electrode of said first transistor being connected to said third electrode of said third transistor for forming a first signal transmitting path;
   b. second and fourth transistors having first, second and third electrodes, said first electrode of said second transistor being connected to said third electrode of said fourth transistor for forming a second signal transmitting path;
   c. a current sink connecting in common to said first and second signal transmitting paths;

d. means for supplying an input signal to said second electrodes of said first and second transistors differentially;
e. an output terminal connected to at least one of said first and second signal transmitting paths;
f. a semiconductor device comprising a first semiconductor region of one conductivity type having a predetermined impurity concentration, a second semiconductor region of the other conductivity type having a predetermined impurity concentration interfaced with said first region and forming a first semiconductor PN junction with said first region, a third semiconductor region of the same conductivity type as said first region having a predetermined impurity concentration interfaced with said second region at a point spaced from said first junction and forming a second PN semiconductor junction with said second region, a fourth semiconductor region of the same conductivity type as said first region interfaced with said first region, having a predetermined impurity concentration substantially higher than that of said first region and spaced from said first PN junction by a distance smaller than the diffusion length of minority carriers injected into said first region from said second region when said first PN junction is forwardly biased, said first and fourth regions forming a first low-high impurity concentration semiconductor junction at their interface, a fifth semiconductor region of the same conductivity type as said third region interfaced with said third region, having a predetermined impurity concentration substantially higher than that of said third region and spaced from said second PN junction by a distance smaller than the diffusion length of minority carriers injected into said third region from said second region when said second PN junction is forwardly biased, said third and fourth regions forming a second low-high impurity concentration semiconductor junction at their interface, the difference in impurity concentrations on opposite sides of each of said first and second low-high impurity concentration semiconductor junctions being selected to provide an energy barrier higher than the energy level of said injected minority carriers reaching said low-high impurity concentration junctions from said second region;
g. first, second and third terminals led from said first, second and third regions, respectively, said first and third terminals being connected to a connection between said first and third transistors and a connection between said second and fourth transistors, respectively;
h. first means for supplying a control bias to said second terminal of said semiconductor device; and
i. second means for supplying a control bias to the second electrodes of both the third and fourth transistors.

* * * * *